United States Patent
Bruel

(10) Patent No.: US 8,759,196 B2
(45) Date of Patent: Jun. 24, 2014

(54) METHOD FOR PREPARING A SUBSTRATE BY IMPLANTATION AND IRRADIATION

(75) Inventor: Michel Bruel, Veurey-Voroize (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/700,435

(22) PCT Filed: Jun. 8, 2011

(86) PCT No.: PCT/EP2011/059440
§ 371 (c)(1),
(2), (4) Date: Nov. 27, 2012

(87) PCT Pub. No.: WO2011/160950
PCT Pub. Date: Dec. 29, 2011

(65) Prior Publication Data
US 2013/0072009 A1    Mar. 21, 2013

(30) Foreign Application Priority Data
Jun. 24, 2010 (FR) ................... 10 55058

(51) Int. Cl.
*H01L 21/30* (2006.01)
(52) U.S. Cl.
USPC ............. 438/458; 438/473; 257/E21.568
(58) Field of Classification Search
USPC ........... 438/475; 257/E21.48, E21.497
See application file for complete search history.

(56) References Cited

U.S. PATENT DOCUMENTS

| 2004/0110395 | A1 | 6/2004 | Ueda et al. ........... 438/795 |
| 2007/0128774 | A1* | 6/2007 | Yamada ................ 438/149 |
| 2009/0053877 | A1 | 2/2009 | Bruel ..................... 438/463 |
| 2009/0246935 | A1 | 10/2009 | Kawai et al. .......... 438/458 |
| 2011/0227068 | A1* | 9/2011 | Akiyama ................ 257/43 |

FOREIGN PATENT DOCUMENTS

| EP | 1 351 308 A1 | 10/2003 |
| JP | 2005-252244 | 9/2005 |
| WO | WO 2010/067835 A1 | 6/2010 |

OTHER PUBLICATIONS

International Search Report, PCT/EP2011/059440, mailed Aug. 1, 2011.
Kunoh, Y. et al., "Fabrication of Light Emitting Diodes Transferred onto Different Substrates by GaN Substrate Separation Technique", Phys. Status Solidi, vol. 7, Nos. 7-8, pp. 2091-2093 (2010).

* cited by examiner

*Primary Examiner* — Cheung Lee
(74) *Attorney, Agent, or Firm* — TraskBritt

(57) ABSTRACT

A method for preparing a substrate for detaching a layer by irradiation of the substrate with a light flux for heating a buried region of the substrate and bringing about decomposition of the material of that region to detach the detachment layer. The method includes fabricating an intermediate substrate including a first buried layer, and a second covering layer that covers all or part of the first layer, with the covering layer being substantially transparent to the light flux and with the buried layer formed by implantation of particles into the substrate, followed by absorbing the flux, and selectively and adiabatically irradiating a treated region of the buried layer until at least partial decomposition of the material constituting it ensues.

18 Claims, 2 Drawing Sheets

METHOD FOR PREPARING A SUBSTRATE BY IMPLANTATION AND IRRADIATION

CROSS-REFERENCE TO RELATED APPLICATIONS

This application is a national phase entry under 35 U.S.C. §371 of International Patent Application PCT/EP2011/059440, filed Jun. 8, 2011, designating the United States of America and published in English as International Patent Publication WO 2011/160950 A1 on Dec. 29, 2011, which claims the benefit under Article 8 of the Patent Cooperation Treaty and under 35 U.S.C. §119(e) to French Patent Application Serial No. 1055058, filed Jun. 24, 2010.

FIELD OF THE INVENTION

The present invention relates to a method for preparing a substrate made of semiconductor materials, for the purpose of detaching a layer of the substrate.

BACKGROUND OF THE INVENTION

Semiconductors of the III-N type, that is having the general formula $Al_xGa_yIn_{1-x-y}N$ where $0 \leq x \leq 1$, $0 \leq y \leq 1$ and $x+y \leq 1$, and GaN in particular, have characteristics which make them very attractive for the optoelectronic field, power components and radio frequency applications.

However, the development of these applications is slowed by the techno-economic limits of the substrates.

Indeed, device manufacturing depends generally on the transfer to a supporting substrate of a thin layer taken from a donor substrate, which is a massive substrate of high quality III-N material suited to the intended application.

The SMARTCUT® process in particular is a well-known transfer technique, which consists generally of implanting a dose of atomic or ionic species into a donor substrate, so as to create in it an embrittlement zone at a predetermined depth, thus delimiting the thin layer to be transferred, sticking the donor substrate onto a support substrate or receptor substrate, and causing the donor substrate to break at the embrittlement zone, thus allowing the detachment of the thin layer stuck to the receptor substrate. In this technology, the separation of the layer to be transferred and its detachment from the donor substrate are obtained by the creation of crystal defects such as platelets and holes induced by the implanted species and their coalescence in a plane by thermal activation.

However, in the case of substrates made of III-N material, implantation requires doses of atomic or ionic species that are five to ten times greater than in silicon, which results in a considerably increased process cost.

A method for manufacturing a thin plate of a semiconductor with a wide band gap which can be transferred to a handling substrate in as thin a form as possible without damaging the substrate is described in document WO2010/067835.

The method includes an ion implantation from the surface of a wide band-gap semiconductor in order to form an ion implantation layer, a step of applying a surface activation treatment to at least the aforementioned surface of the handling substrate, a step of bonding the surface of the wide band-gap semiconductor to the surface of the handling substrate to obtain a bonded body, a step of applying a heat treatment to the bonded body at a temperature of 150 to 400° C., and a step of exposing the ion implantation layer to visible light to embrittle the ion implantation layer and transfer the wide band-gap semiconductor layer onto the handling substrate.

As stated above, the light exposure step is intended to embrittle the ion implantation layer, so this technique is fully akin to the SMARTCUT® process mentioned earlier, including the consequent cost considerations. Indeed, implantation is carried to embrittle the layer of interest, then heat treatment to activate the creation of crystalline defects, and to finally fracture the layer of interest layer at the crystalline defects.

Further, the article "Fabrication of light emitting diodes transferred onto different substrates by GaN substrate separation technique" (Y. Kunoh et Al./*Phys Status Solidi* C7, N) 7-8, 2091-2093 (2010)/DOI10.002/pssc200983576)" describes a technique in which two stacked layers are created, i.e., a layer that absorbs visible light covered by a layer that is "transparent" to the same light. The properties of the buried layer, presented as a sacrificial layer, are modified.

This modification is carried out immediately following fabrication of the layer, that is to say before it is covered by the transparent layer.

It is carried out by annealing, which "thermally decomposes" the layer.

This decomposition performed before the formation of the transparent layer is presented as making it possible to "avoid ending up with a thermally damaged surface layer (LED)."

Growth of the transparent layer on the sacrificial layer is then accomplished by epitaxy, then irradiation with a light allowing transfer to the sacrificial layer.

It therefore seems that the annealing allows the initiation of the decomposition of the sacrificial layer, making it more absorbent, which is then completed by irradiation with light.

This therefore involves the decomposition of a layer which will subsequently be covered by epitaxy. This constitutes a major drawback, because the surface of the sacrificial layer is degraded by these treatments, so that it no longer has an optimal crystal matrix for epitaxy.

One of the objectives sought by the present invention is particularly to develop a preparation method for a substrate made of semiconductor materials, with the aim of detaching a layer of the substrate, which does not have the limitations of the existing methods and is less costly.

SUMMARY OF THE INVENTION

To this end, the invention proposes a preparation method for a substrate made of semiconductor materials with the aim of detaching a layer, called a detachment layer, from the substrate by irradiation of the substrate with a light flux to heat a buried region of the substrate and bring about the decomposition of the material so as to detach the detachment layer, the method comprising the steps consisting of:

a) fabricating an intermediate substrate comprising a first layer, called the buried layer, and a second layer, called the cover layer, covering all or part of the first layer, the material of the first layer having absorption optical properties different from the absorption optical properties of the material of the second layer, the cover layer being substantially transparent to the light flux, the buried layer, made by implantation of particles in the substrate, absorbing the light flux for its part, b) selectively and adiabatically irradiating a region, called the treated region, of the buried layer to increase its optical absorption properties for the light, until the at least partial decomposition of the material of which it consists.

By the term "absorbing" is meant that a considerable part, that is at least 10% of the flux reaching the buried layer, of the flux energy is absorbed by the material of the buried layer.

Selective and adiabatic irradiation allows a reduction of the light budget needed for detachment of the buried layer.

According to other advantageous and non-limiting features of the method:
- the implanted particles are light ions;
- the ions are included in the group $H^+$ and $He^+$;
- the implanted dose is between $10^{14}$ and $2\times10^{16}$ atoms $cm^{-2}$;
- the implantation is implemented after fabrication of the intermediate substrate;
- the implantation is implemented before fabrication of the intermediate substrate;
- the period of irradiation of the zone by light flux is so chosen that the thermal diffusion length corresponding to this period is shorter than or of the same order as the thickness of the layer;
- between step a) and step b), or after step b), the substrate is bonded to another part;
- the other part is substantially transparent to the wavelength of the light flux, and the light flux is applied through the other part;
- the substrate is a compound material of the III-V group;
- the composition of the compound material is of the Alx-GayIn1-x-yN kind, where $0 \le x \le 1$, $0 \le y \le 1$ and $x+y \le 1$;
- the substrate is a piezoelectric material such as lithium niobate, lead titanozirconate, an alloy, a glass, a solid solution, particularly one not in thermodynamic equilibrium;
- the substrate is made of a compound semiconductor material for the electronics, optical or optoelectronic industry and, after step b), a thermal and/or mechanical load is applied to the buried layer, so as to induce the detachment of a layer located between the surface of the substrate and the buried layer;
- step a) includes the formation of a discrete crystalline layer in a material with an absorption coefficient greater than the absorption coefficient of the layer material;
- the particles are implanted in the discrete crystalline layer;
- the discrete crystalline layer is made of InGaN or AlGaN and the transparent layer of GaN.

BRIEF DESCRIPTION OF THE DRAWING FIGURES

Other aims, features and advantages of the invention will be better understood in the light of the detailed description that follows, with reference to the appended drawings in which.

Figure 4:
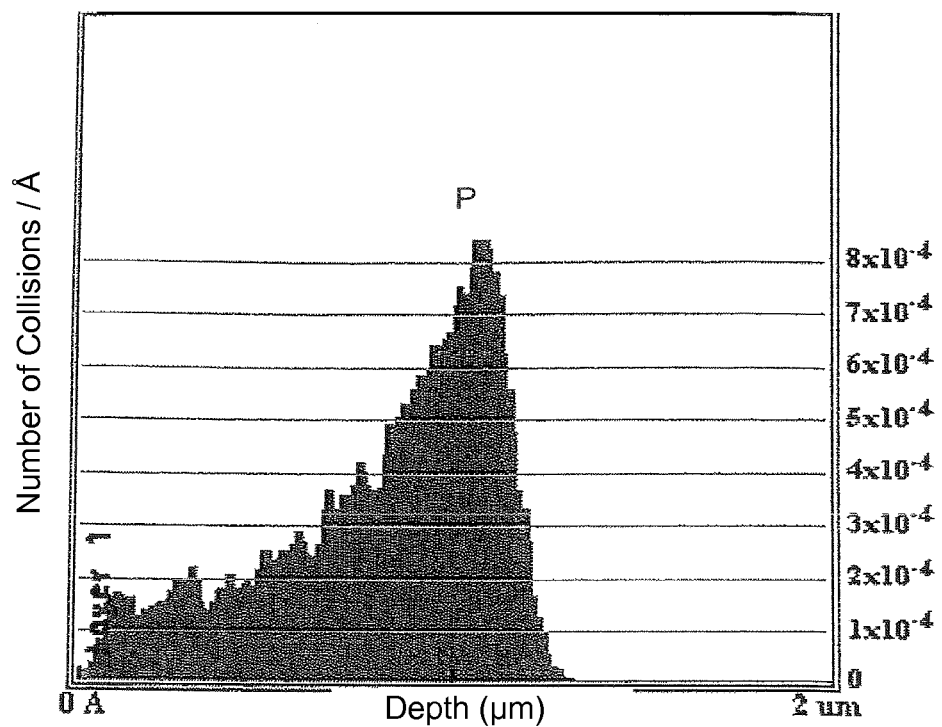

FIG. 4 illustrates the defect profile generated by the particles upon their implantation within the substrate. In other words, this figure shows, as a function of depth, the number of collisions, in a layer 1 Å thick, caused by an incident ion and liable to result in a defect. This graph is therefore representative of the shape of the defect profile after the implantation step.

DETAILED DESCRIPTION OF THE INVENTION

The invention applies to any substrate made of a compound material, crystalline or not, whose optical absorption properties (particularly the optical absorption coefficient within a given range of frequencies, or the imaginary part of the index of refraction) are capable of being modified within a localized zone by an implantation of particles. The compound material must also be capable of decomposing in this zone under the influence of an energy input by a light flux in and near this zone.

By "compound material" is meant a material made up of at least two elements.

By "decomposition" is meant an alteration of the fundamental structure of the material that can consist, depending on the material, of a phase separation, the creation of new phases, the creation of inclusions, etc.

Compound materials are materials made up of at least two types of atoms. Among the compound materials can be mentioned the III-V compound semiconductors in particular, and particularly the nitrides (that is III-N compounds with the general formula $Al_xGa_yIn_{1-x-y}N$ where $0 \le x \le 1$, $0 \le y \le 1$ and $x+y \le 1$), but also the piezoelectric materials (lithium niobate, lead titanozirconate . . . ) the alloys, the glasses, the solid solutions, particularly those not in thermodynamic equilibrium.

In the present text, the term "substrate" not only covers a substrate usable in the electronics, optical or optoelectronic industry, but also an ingot, a ball or any other object having a face through which the implantation will be carried out, with a roughness amplitude significantly less than the penetration depth of the ions.

In the non-limiting example described above with reference to FIGS. 1 through 3, it is assumed that the part 1 to be treated is a substrate made of a material with the composition $Al_xGa_yIn_{1-x-y}N$ where $0 \le x \le 1$, $0 \le y \le 1$ and $x+y \le 1$.

Figure 1:
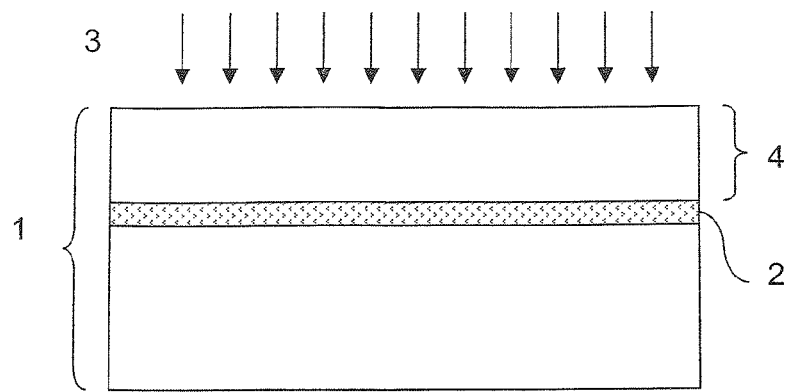
FIG. 1 illustrates the formation of an optically modified buried layer, in a substrate.

As can be seen in FIG. 1, a first step of the method comprises the modification of the optical properties of a buried zone constituting the buried layer 2 of the substrate 1.

What is meant by "buried" is that the layer 2 does not extend all the way to the surface of the substrate, but is situated between two planes parallel to the surface of the substrate, each located at a nonzero depth from the surface of the substrate. In other words, this buried layer 2 is not flush with the surface of the substrate and the optical absorption properties are not significantly modified outside of this buried layer 2.

In this first step, the absorption coefficient of the zone becoming the buried layer 2 is increased with respect to the absorption coefficient of the rest of the substrate 1.

To this end, particles 3 are implanted into the substrate 1, the implantation parameters (basically the type of ions, the dose and the energy) being determined according to the thickness and the depth of the buried layer 2 that it is desired to form and of the desired value of the absorption coefficient.

Thus, the implanted particles are preferably ions, gaseous or not, such as helium and hydrogen ions.

Relatively heavy ions such as lithium, for a given depth, require much higher energies than hydrogen for example. But they are much more effective in creating defects and thus modifying the absorption coefficient.

The implanted dose is typically between $10^{14}$ and $2.10^{16}$ ions·$cm^{-2}$.

It will be noted in this regard that this is a much smaller dose than that used to embrittle a substrate for the implementation of a method of the SMARTCUT® type, where the usual dose is greater than $10^{17}$ ions·$cm^{-2}$, in III-V compound materials.

The fact of selecting "light" ions allows the energy expended within the material to be essentially energy deposited by electronic braking, which does not induce defects in the thickness being crossed, except at the end of the travel where the particles transfer a significant part of their energy by nuclear collisions, thus creating defects.

Under these conditions, and as can be seen in the graph in FIG. 4 (the abscissa axis indicating the depth (in μm) from the substrate surface through which the implantation is carried out, and the ordinate axis indicating the number of defects), the shape of the created defects profile has an amplitude that grows starting at the surface, which reaches a definite peak P at a depth near the target depth. More precisely, this figure shows, as a function of depth, the number of collisions, in a layer of 1 Å thickness, caused by an incident ion and capable of bringing about a defect. This graph is representative of the defect profile shape after the implantation step.

During implantation, it is preferable that the substrate temperature do not rise too much, to avoid self-healing phenomena that would make the implantation less effective with regard to changing the optical properties of the buried layer. Thus the implantation conditions are selected so that the substrate temperature remains preferably in a lower temperature range, for example between the ambient temperature and 200° C.

Such an implantation of the particles 3 has the effect of creating defects at the buried layer 2 that corresponds substantially to the end-of-travel region of the particles 3, while region 4 traversed by the particles 3, between the surface of the substrate 1 and the buried layer 2, is not significantly disturbed and therefore retains substantially its initial optical properties.

In the case where the material is a crystalline semiconductor, one of the possible effects of the defects in the buried layer is to create sublevels within the band gap of the semiconductor.

These defects and the associated disturbances generate an increase in the absorption coefficient of the buried layer, to a degree that depends on the implanted dose. Generally, the greater the implanted dose, the more the optical properties are modified. For a very large implanted dose, a saturation effect may appear.

Consequently, the person skilled in the art will select an adequate dose depending on the substrate material to obtain the desired variation in the absorption coefficient.

To this end, he may carry out implantation tests with different doses and measure the resulting absorption coefficient, using known instruments such as a spectrophotometer for example.

As a matter of preference, the thickness of the buried layer 2 is at least 0.1 micrometer, and its absorption coefficient lies between 1000 and 50,000 $cm^{-1}$.

This first step in the method has thus made it possible to "mark," that is to locally delimit, within the thickness of the substrate 1, a buried layer 2, which is distinguished from the rest of the substrate 1 by differing optical properties.

It is stated that the buried layer 2 is initially of the same material as the rest of the substrate 1, of which before treatment it constituted a region, which will produce, after treatment, a distinct layer.

The depth of the layer 2 whereof the optical properties are considerably modified, and its thickness, must be such that it is truly buried, that is so that it does not extend to the free surface of the compound.

It is possible, after this first treatment step, to thicken the substrate 1, that is to give it a more substantial thickness, for example by epitaxial growth using the same material as that of the substrate 1, or even a different material but one the lattice parameter whereof matches that of the material of the substrate 1. This "thickening" will result in burying the optically modified layer 2 more deeply, a posteriori.

This deposit must be "transparent" to light, as will be explained hereafter, and must be formed by a process that has no effect on the absorption coefficient modification accomplished earlier.

Figure 2:
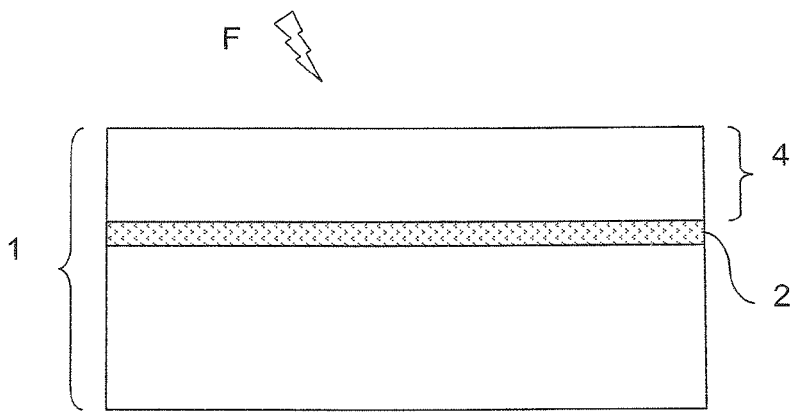
FIG. 2 illustrates the irradiation of the substrate containing the buried layer by a light flux.

With reference to FIG. 2, the surface of the substrate 1 is irradiated with a light flux F having a wavelength selected so that the buried layer 2 absorbs the wavelength while the rest of the substrate (layer 4), located between the surface and the buried layer the optical properties whereof have been modified, is substantially transparent to the wavelength.

What is meant by "substantially transparent" is that the substrate 1 may possibly be able to absorb a small quantity of the light flux, but that this possible slight absorption would generate, during the time required for irradiation of the buried layer, only a slight heating of the part of the substrate traversed and, more precisely, would be limited to a temperature far below the decomposition temperature of the material. It also means that the modification of the optical properties of the layer 4 of the substrate due to this rise in temperature, does not noticeably disturb the passage of the light flux reaching the buried layer 2.

However, the light flux has an energy density and an interaction period selected so that the absorption by the buried layer 2 leads to heating of that layer.

The light flux F can have any wavelength appropriate to the absorption coefficient of the buried layer 2, and can therefore belong to the visible, the infrared or the ultraviolet range.

The light flux F can be impulsive, that is made up of light pulses spread over time, or continuous. In the latter case, the irradiation of the substrate 1 will preferably be performed by sweeping the light flux, such that a given point of its surface receives the light flux in the form of pulses spread over time.

The interaction of the light flux with the buried layer 2 is adiabatic, that is to say that the temperature rise is substantially confined to the zone where the light flux deposits its energy (which is also the zone in which the optical properties have been modified). This adiabatic property allows the buried layer to be selectively heated, and the decomposition of the material to be confined to it, as will be described later.

To this end, the parameters of the light flux will be selected such that the necessary interaction period will be as short as possible.

A simple rule for setting the order of magnitude is for example to select the interaction period $\tau$ (tau) so that the thermal diffusion length corresponding to that period $\tau$ is less than or of the same order as the thickness of the zone 2 the optical properties whereof have been modified.

For example, with a diffusion coefficient (D) of 0.1 $cm^2/s$, a thickness of the optically modified layer 2 of 500 nm and an absorption coefficient greater than 20,000 $cm^{-1}$ making this layer absorbent for virtually the entire incident flux, $\tau$ will be selected such that $\sqrt{D\tau}=500$ nm, which gives a value of 25 nanoseconds for $\tau$.

It will be recalled that the thermal diffusion coefficient is defined by the relation $k/(\rho \cdot C)$ in $m^2/s$, with k=thermal conductivity of the material, $\rho$(ro)=density of the material and C, the thermal capacity per unit mass (or specific heat).

If more accuracy is desired, a quick simulation using commercial 2D software, for example, allows this value to be quickly refined.

Knowing the thickness of the layer 2, the volume of the material receiving the light flux is also known and, via the specific heat, the necessary energy volume density and the energy density of the light flux needed to attain the desired temperature are deduced.

For example, in the foregoing case with a thickness of 500 nm, where the specific heat would be 1 $J/(cm^3 \times °C.)$ and the temperature to be attained is 500° C. above the ambient temperature, the following calculation is performed:

For a volume with a sectional area of one $cm^2$, the volume in question is then (1 $cm^2 \times 500$ nm), or $5 \times 10^{-5}$ $cm^3$.

The necessary energy per unit volume to raise this material 500° C. above ambient is therefore: 500° C.$\times 1$ J/($cm^3 \times °$ C.)=500 J/$cm^3$.

The necessary energy is therefore $500 \times 5 \times 10^{-5} = 2.5 \times 10^{-2}$ J, which therefore corresponds to a light flux with an energy density of $2.5 \times 10^{-2}$ J/$cm^2$.

This energy being delivered within 25 nanoseconds (ns), the power flux required therefore has a value of ($2.5 \times 10^{-2}$ J/$cm^2/25 \times 10^{-9}$=1000 kW/$cm^2$.

This light flux can be obtained by means of a laser.

The light flux can be applied to the face of the substrate through which the implantation of the particles 3 took place, but also, alternatively, from the opposite face of the substrate.

Figure 3:
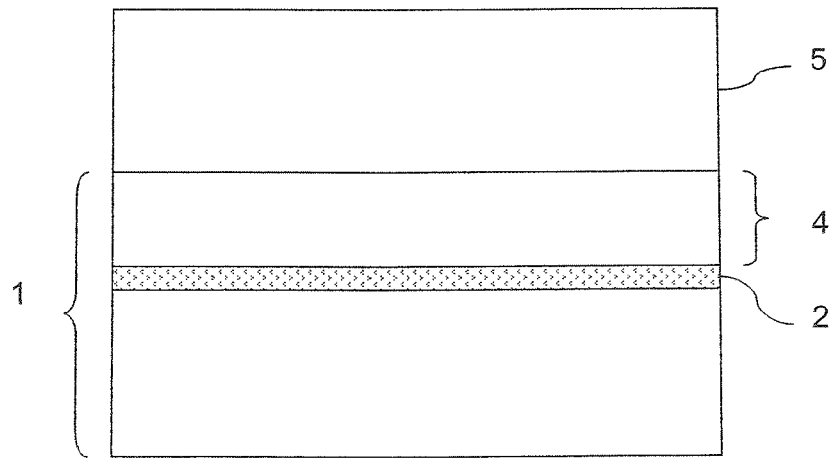
FIG. 3 illustrates bonding the substrate to a support.

According to one particular embodiment, one face of the substrate 1 can, after implantation, be bonded to another part 5, as shown in FIG. 3.

This part 5 can have for instance the function of a rigid or flexible support, particularly when the subsequent detachment of a layer of the substrate is contemplated.

In this case, irradiation by the light flux can take place on the free surface of the substrate, or on the free and exposed face of part 5, if the latter is also substantially transparent to the wavelength of the light flux.

If the selective heating of the buried layer 2 resulting from the application of the light flux is sufficiently intense, local decomposition of the material takes place, at least partially, within this layer, or phase separation, embrittlement, the creation of new phases, etc.

For example, in the case of GaN, it has been observed that a temperature rise beyond about 900° C. led to decomposition resulting in the appearance of a metallic gallium phase and a gaseous nitrogen phase.

Especially advantageously, this modification can be exploited to embrittle the substrate 1 at the buried layer 2, then to detach from the substrate 1 the layer 4 that is located between the surface of the substrate and the layer 2.

The detachment step may require the addition of thermal and/or mechanical energy by means well known to the person skilled in the art.

In an embodiment of the invention that is not shown, the implantation step can be implemented in a discrete crystalline layer, made up of a material with an absorption coefficient greater than the absorption coefficient of the material of the transparent layer. The transparent layer 4 can be formed over the crystalline transparent layer, by epitaxy for example, before or after the implantation step. In this embodiment, greater absorption is available at the layer 2. Also in such a case, the upper surface of the discrete crystalline layer being of excellent quality due to not being affected by the implantation step, this has a favorable effect on the quality of the discrete crystalline layer/layer 4 interface and on the layer 4 itself.

What is claimed is:

1. A method for preparing a substrate for detaching a layer therefrom by bringing about decomposition of substrate material in a buried region of the substrate to detach the layer, which comprises:
   fabricating an intermediate substrate that includes a first layer that is buried, and a second layer that covers all or part of the first layer, with the covering layer being substantially transparent to a light flux, and the buried layer formed by implanting particles into the intermediate substrate, and
   selectively and adiabatically irradiating a region of the buried layer before bonding the intermediate substrate to a supporting substrate to treat the buried layer until at least partial decomposition of the material constituting the buried layer ensues in order to reduce an amount of energy needed for detaching the covering layer.

2. The method according to claim 1, wherein the implanted particles are ions of $H^+$ or $He^+$.

3. The method according to claim 2, wherein the ions are implanted at a dose of between $1 \times 10^{14}$ and $2 \times 10^{16}$ atoms·$cm^{-2}$.

4. The method according to claim 1, wherein the implantation is conducted after the forming of the covering layer.

5. The method according to claim 1, wherein the implantation is conducted before the forming of the covering layer.

6. The method according to claim 1, wherein the light flux is applied to the region of the buried layer at an irradiation period selected such that a thermal diffusion length is provided that is smaller than or on the same order as the thermal diffusion length of the thickness of the buried layer.

7. The method according to claim 1, wherein the substrate is bonded to a supporting substrate after irradiating the region of the buried layer.

8. The method according to claim 1, wherein the substrate comprises a group III-V material.

9. The method according to claim 8, wherein the group III-V material is $Al_xGa_yIn_{1-x-y}N$, where $0 \leq x \leq 1$, $0 \leq y \leq 1$ and $x+y \leq 1$.

10. The method according to claim 8, wherein the group III-V material is a piezoelectric material, lithium niobate, lead titanozirconate, an alloy, a glass, or a solid solution.

11. The method according to claim 1, wherein the substrate is made of a compound semiconductor material for the electronic, optical or optoelectronic industry, and that after the irradiation, a thermal or mechanical load is applied to the buried layer to provide an amount of energy that is sufficient to detach the covering layer.

12. The method according to claim 1, wherein the implantation conditions are selected such that the substrate temperature remains between ambient and 200° C.

13. The method according to claim 1, wherein the buried layer has an absorption coefficient of between 1000 and 50,000 $cm^{-1}$ and a thickness of at least 0.1 micrometer.

14. A method for preparing a substrate for detaching a layer therefrom by bringing about decomposition of substrate material in a buried region of the substrate to detach the layer, which comprises:
   fabricating an intermediate substrate that includes a first layer that is buried, and a second layer that covers all or part of the first layer, with the covering layer being substantially transparent to a light flux, and the buried layer formed by implanting particles into the intermediate substrate, and
   selectively and adiabatically irradiating a region of the buried layer to treat it until at least partial decomposition of the material constituting the buried layer ensues in order to reduce an amount of energy needed for detaching the covering layer,
   wherein the formation of the substrate includes forming a discrete crystalline layer in a material that has an absorption coefficient greater than the absorption coefficient of the material of the buried layer.

15. The method according to claim 14, wherein the particles are implanted into the discrete crystalline buried layer.

16. The method according to claim 15, wherein the discrete crystalline layer is made of InGaN or of AlGaN and the covering layer is made of GaN.

17. A method for detaching a layer from a substrate by irradiation, which comprises:

fabricating an intermediate substrate that includes a buried layer, and a covering layer that covers all or part of the buried layer, with the covering layer being substantially transparent to a light flux, and the buried layer formed by implanting particles into the substrate to form a region that absorbs the light flux, with the buried layer having an absorption coefficient of between 1000 and 50,000 cm$^{-1}$ and a thickness of at least 0.1 micrometer, and with the implantation conditions selected such that the substrate temperature remains between ambient and 200° C., and selectively and adiabatically irradiating a region of the buried layer before bonding the intermediate substrate to a supporting substrate to treat the buried layer until at least partial decomposition of the material constituting the buried layer ensues in order to reduce an amount of energy needed for detaching the covering layer.

18. The method according to claim 17 which further comprises implanting particles that are ions of H$^+$ or He$^+$ at a dose of between $1\times10^{14}$ and $2\times10^{16}$ atoms·cm$^{-2}$, bonding the covering layer of the irradiated intermediate substrate to a supporting substrate, and then applying a thermal or mechanical load to the decomposed buried layer to provide an amount of energy that is sufficient to detach the covering layer and transfer it to the supporting substrate.

\* \* \* \* \*